United States Patent [19]

Belanger, Jr.

[11] Patent Number: 4,985,748
[45] Date of Patent: Jan. 15, 1991

[54] UNIVERSAL TAPE FOR USE IN TAPE AUTOMATED BONDING SYSTEM

[75] Inventor: Thomas D. Belanger, Jr., Saline, Mich.

[73] Assignee: AG Communication Systems Corporation, Phoenix, Ariz.

[21] Appl. No.: 457,637

[22] Filed: Dec. 27, 1989

[51] Int. Cl.⁵ .................... H01L 23/48; H01L 23/28; H01L 39/02
[52] U.S. Cl. ........................... 357/69; 357/68; 357/70; 357/72; 357/80; 357/65
[58] Field of Search .................. 357/69, 68, 70, 72, 357/65, 80; 29/827; 174/52.4

[56] References Cited

U.S. PATENT DOCUMENTS 4,663,650 5/1987 Gilder, Jr. et al. ............... 357/70

Primary Examiner—William Mintel
Assistant Examiner—Roy Potter
Attorney, Agent, or Firm—Robert J. Black; Gregory G. Hendricks

[57] ABSTRACT

An improved method of tape automated bonding that makes use of a "universal" tape to accommodate integrated circuit chips having different bonding site patterns. The tape comprises a series of parallel continuous thin metal beam lead conductors fixed to a flexible plastic substrate. Two such tapes are disposed at right angles to each other forming in effect a square matrix of beam lead conductors. Each tape site is custom trimmed to match the bonding pad locations of each different integrated circuit chip.

5 Claims, 2 Drawing Sheets

UNIVERSAL TAPE FOR USE IN TAPE AUTOMATED BONDING SYSTEM

BACKGROUND OF THE INVENTION

1. Field of the Invention

The present invention relates to the bonding of integrated circuit chips onto a continuous tape and more particularly to such an arrangement of bonding onto a tape on which are etched circuit conductor patterns as utilized in tape automated bonding systems.

2. Background Art

The process of bonding integrated circuit chips to a continuous tape on which are located etched circuit conductor patterns is known as tape automated bonding, or TAB. This particular process is desirable for three main reasons. The first of these is that the bonding area required on the integrated circuit is less than what is required for wire bonding. Secondly, the process is designed for automated handling, and finally, with the dice mounted on a tape the devices may be pretested before final assembly.

Such tapes are typically constructed by etching a conductive material which is supported by a flexible backing so that a series of conductors are formed. These conductors may then be aligned with bonding sites on the integrated circuit. After the conductors are etched, the support backing is etched away from the bonding region, thus creating a pattern of free beams. The support medium may be prepunched to form a bonding window. Once the beams are formed they are then plated with tin. Prior to the bonding cycle, the integrated circuit dice are bump plated with gold. The gold is used so that during the bonding cycle it may be dissolved with tin, which is plated on the tape, to form a gold/tin eutectic bond. This eutectic then forms the bond between the tape and the integrated circuit.

It is therefore both desirable and necessary to design a unique beam pattern for each and every integrated circuit which is to be bonded. This particular design limitation limits the use of the tape automated process to integrated circuits which will be assembled in high volume, since the cost of tape design and fabrication is also quite high.

SUMMARY OF THE INVENTION

Obviously, one of the major drawbacks in developing the tape automated bonding process is the availability of an etched tape to match bonding sites on the integrated circuits in which the process is to be utilized. This need for a universal tape pattern can be expanded to the need of an assembly operation which requires flexibility in processing a variety of integrated circuits into various packages.

The present invention presents a tape pattern for use with the tape automated bonding process, which may be modified to match the bonding site patterns on the integrated circuits to be used, regardless of size. This particular arrangement is accomplished by sectioning the bonding areas into horizontal and vertical conductor pattern regions. Each region is then trimmed prior to the bonding cycle. The present design of the universal tape for a tape automated bonding process takes into consideration the need to bond both integrated circuits with high and low input/output lead counts. To accomplish the objective the arrangement was to divide the tape into two regions, a horizontal and vertical conductor pattern. This arrangement was accomplished by means of the use of two tapes. Each tape was trimmed via an offline process, or along with the inline bonding process. Once trimmed, the two tape sections are aligned to the bonding site of the integrated circuit and are bonded to the die. The bonding process then holds both tape sections in alignment for further processing.

In accordance with the present invention, the tape patterns used are the same for both tapes, except they are rotated 90 degrees to each other. The present design does include one major restriction. That is, the inclusion of the bonding sites must be on given increments. It has been determined it is possible to fabricate tape with beams 0.002" wide on 0.002" spacing. Thus, this limitation as an application restriction is substantially reduced.

When the two tapes are overlayed, it is possible to bond to several bonding sites within the conductor array. The assembly, bond known as the outer lead bond, will make use of the narrow beams inside the support ring for small die and outside an included support ring for larger dice.

DESCRIPTION OF THE PREFERRED EMBODIMENT

Figure 1:
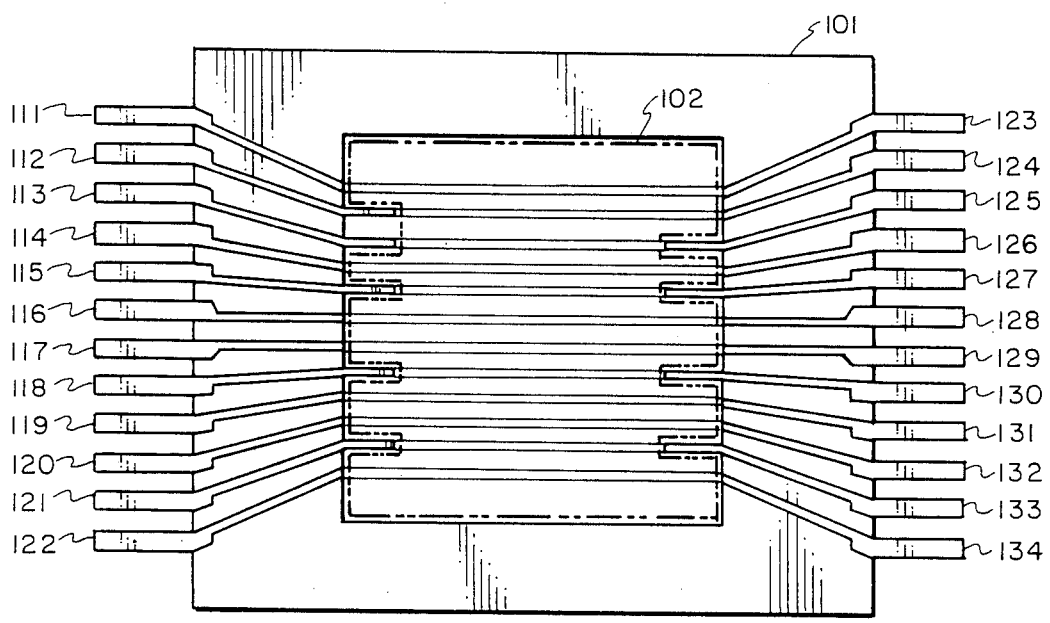
FIG. 1 is a pictorial layout of a tape design for horizontal conductors in accordance with the terms of present invention.

Referring now to FIG. 1, the bonding area for a horizontal conductor pattern is shown. As can be seen, a vertical pattern is glued onto a second medium, such as a tape 101 of polyimide. The beam pattern shown in FIG. 1 consists of beams 111 through 122 extended at the left side of the tape and continue across the tape and conclude as connections 123 through 134, respectively.

Figure 2:
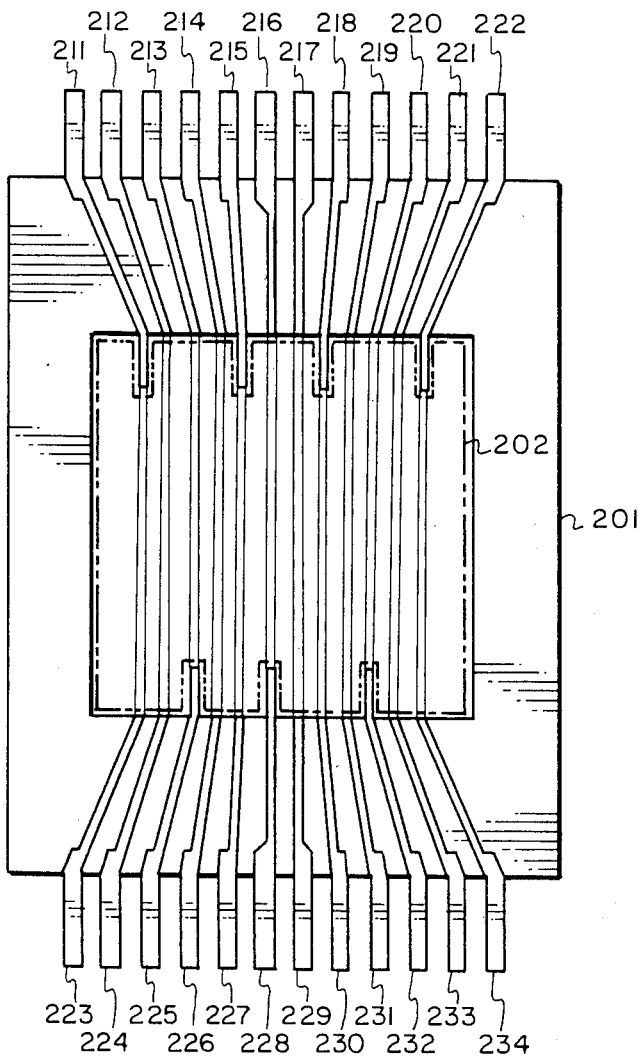
FIG. 2 is a pictorial diagram of a tape with the vertical conductors in accordance with the terms of the present invention.

A similar pattern arrangement is shown in a vertical tape pattern in FIG. 2 wherein beams 211 through 222 inclusive are superimposed in a pattern on a support background, such as 201, and exit as beam connections 223 through 234, respectively.

Referring back to FIG. 1, a dashed line 102 shows the area in the interior which may be removed by laser or mechanical trimming depending on the needs for a particular pattern of beams for connection to an integrated circuit chip. A similar dashed line, such as 202, is also shown in FIG. 2 and defines that area which is also removed on the vertical pattern tape to define just those beam leads which will be utilized for connection to an integrated circuit. For example, in FIG. 1 as may be seen beams 112, 113, 115, 118 and 121 are trimmed to position where they are to be connected to bonding sites on an integrated circuit chip. Beam connections 125, 127, 130 and 133 also are available for connection to bonding sites of an integrated circuit chip.

Referring to FIG. 2 in the vertical pattern, beams 211, 215, 218, 222, and beam connections 225, 228 and 232 all project into the center area and will act as beams for connection to the bonding site of a selected integrated circuit.

Figure 3:
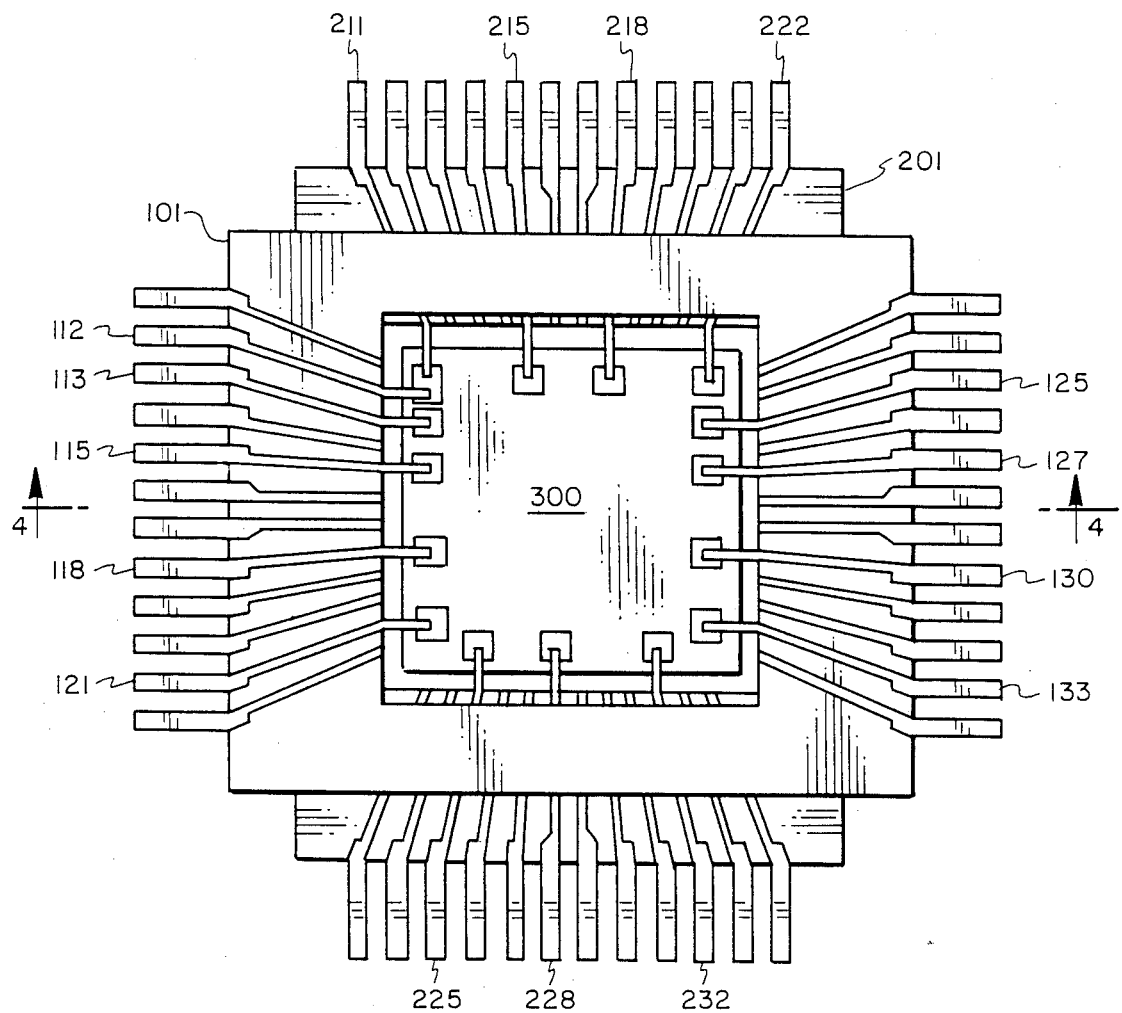
FIG. 3 is a pictorial diagram of horizontal and vertical tapes superimposed on each other to provide a full universal tape for automated bonding process in accordance with the present invention showing an integrated circuit bonded to such a tape.
Figure 4:
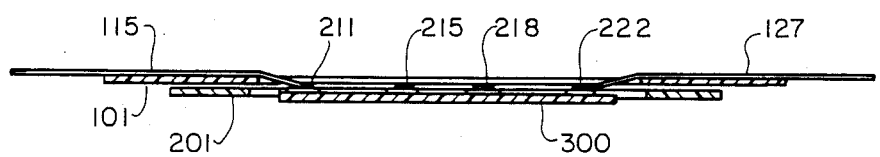
FIG. 4 is a sectional view of horizontal and vertical tapes superimposed on each other taken along section lines 4—4 of FIG. 3.

Referring now to FIG. 3, an integrated circuit chip 300 is shown positioned in the center of the composite unit developed out of both horizontal and vertical patterns. The above outlined beams which have been trimmed for connection to an integrated circuit are shown connected to the bonding sites on circuit 300 to form the necessary connections associated with the particular bonding sites for the selected chip, such as 300.

Thus, a composite universal tape arrangement to make tape lead bonded assemblies is developed and may be useful in those environments that intend to use tape automated bonding. It may be seen from the foregoing that by means of custom trimming by means of a programmable laser or by means of mechanical punch a number of different types of integrated circuit chips can be sequenced into production equipment built for tape handling.

While but a single embodiment of the present invention has been shown it will be obvious to those skilled in the art that numerous modifications may be made without departing from the spirit of the present invention which shall be limited only by the scope of the claims appended hereto.

What is claimed is:

1. A universal tape arrangement to accommodate an integrated circuit chip as part of an improved method of tape automated bonding comprising:

a first tape including a series of parallel continuous thin metal beam lead conductors superimposed on a flexible substrate, each conductor spaced from the other;

a second tape comprising a series of parallel continuous thin metal beam lead conductors superimposed on a flexible substrate, each conductor spaced from the other;

said first and said second tape disposed at right angles to each other to form a square matrix of beam lead conductors;

said tape arrangement trimmed to match said bonding pad locations of said integrated circuit chip whereby one of said tapes serves as a carrier and the other tape has the substrate removed in an area of the integrated circuit, in order that a portion of said beam lead conductors provide support and connection to said chip.

2. A tape arrangement as claimed in claim 1 wherein: said substrates are of polyimide flexible plastic.

3. A tape arrangement as claimed in claim 1 wherein: each of said metal beams are equal in width.

4. A tape arrangement as claimed in claim 3 wherein: there is further provided spacing between each of said beams each being equivalent in width to the width of said beams.

5. A tape arrangement as claimed in claim 1 wherein: unused beam lead conductors are removed by trimming by means of a programmable laser, or in the alternative, by means of a mechanical punch in order that only said portion of said beams matching the bonding pad locations of said integrated chip remain.

* * * * *